(12) United States Patent
Jiang et al.

(10) Patent No.: US 6,844,618 B2
(45) Date of Patent: Jan. 18, 2005

(54) MICROELECTRONIC PACKAGE WITH REDUCED UNDERFILL AND METHODS FOR FORMING SUCH PACKAGES

(75) Inventors: Tongbi Jiang, Boise, ID (US); Farrah J. Storli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 141 days.

(21) Appl. No.: 10/117,551

(22) Filed: Apr. 4, 2002

(65) Prior Publication Data

US 2003/0189243 A1 Oct. 9, 2003

(51) Int. Cl.[7] .......................... H01L 21/44; H01L 21/48; H01L 21/50
(52) U.S. Cl. ....................... 257/684; 438/127
(58) Field of Search ................. 257/684, 678; 438/127

(56) References Cited

U.S. PATENT DOCUMENTS

| | | |
|---|---|---|
| 5,535,101 A | 7/1996 | Miles et al. |
| 5,656,857 A | 8/1997 | Kishita |
| 5,855,821 A | 1/1999 | Chau et al. |
| 5,866,953 A | 2/1999 | Akram et al. |
| 5,871,808 A | 2/1999 | Thompson, Sr. |
| 5,876,498 A | 3/1999 | Thompson, Sr. |
| 5,891,753 A | 4/1999 | Akram |
| 5,898,224 A | 4/1999 | Akram |
| 5,925,930 A | 7/1999 | Farnworth et al. |
| 6,063,647 A | 5/2000 | Chen et al. |
| 6,114,769 A | 9/2000 | Thompson, Sr. |
| 6,133,066 A | 10/2000 | Murakami |
| 6,194,250 B1 | 2/2001 | Melton et al. |
| 6,271,058 B1 | 8/2001 | Yoshida |
| 6,310,288 B1 | 10/2001 | Moden |
| 6,400,033 B1 * | 6/2002 | Darveaux ................ 257/778 |
| 6,448,635 B1 * | 9/2002 | Glenn ..................... 257/676 |
| 2002/0025602 A1 | 2/2002 | Jiang et al. |

FOREIGN PATENT DOCUMENTS

JP 6-287273 A 10/1994

* cited by examiner

Primary Examiner—Alexander Ghyka
(74) Attorney, Agent, or Firm—Perkins Coie LLP

(57) ABSTRACT

A microelectronic package and method for manufacture. The package can include a support member and a microelectronic substrate positioned at least proximate to the support member. The microelectronic substrate can have a first surface and a second surface facing opposite the first surface, with the first surface having an outer edge and facing toward the support member. At least a portion of the first surface can be spaced apart from an interior surface of the support member to define an intermediate region. At least one conductive coupler is coupled between the microelectronic substrate and the support member. A generally electrically non-conductive material is positioned in the intermediate region with the material contacting the support member and the first surface of the microelectronic substrate and having an outer surface recessed inwardly from the outer edge of the microelectronic substrate.

64 Claims, 2 Drawing Sheets

MICROELECTRONIC PACKAGE WITH REDUCED UNDERFILL AND METHODS FOR FORMING SUCH PACKAGES

CROSS-REFERENCE TO RELATED APPLICATION

This application is related to pending U.S. patent Application Ser. No. 09/651,448, (Perkins Coie Docket No. 10829.8528US) titled MICROELECTRONIC ASSEMBLY WITH PRE-DISPOSED FILL MATERIAL AND ASSOCIATED METHOD OF MANUFACTURE, filed Aug. 30, 2000 and incorporated herein in its entirety by reference.

BACKGROUND

FIG. 1 is a partially schematic, cross-sectional illustration of a typical microelectronic device package 10 in accordance with the prior art. The package 10 can include a microelectronic die 20 carried by a support structure 30 and protected by an encapsulant 50. The die 20 can have die solder balls 22 that provide an internal electrical connection to the support member 30. The support structure 30 can include package solder balls 11 that provide external electrical coupling to other devices or circuits. Accordingly, the package 10 can be integrated into consumer or industrial electronic products, such as computers, telecommunication devices and the like.

In one aspect of the arrangement shown in FIG. 1, the package 10 can include an underfill material 40 that adheres the die 20 to the support structure 30 and protects the die solder balls 22 during encapsulation. The underfill material 40 typically extends along the support structure 30 outwardly from the die 20, and upwardly from the support structure 30 along side surfaces 25 of the die 20. One drawback with this arrangement is that the underfill material 40 typically has a coefficient of thermal expansion (CTE) that is substantially different than that of the other components of the package 10. Accordingly, when the package 10 undergoes thermal excursions, for example, during cooling after elevated temperature processes, the underfill material 40 can contract more than the other components within the package 10. As a result, the underfill material 40 can place the side surfaces 25 of the die 20 under tension, which can cause cracks 21 to form in the die 20, and/or can delaminate material from the side surfaces 25. The underfill material 40 can also exert a tensile force on the support structure 30, which can cause the support structure 30 to delaminate. The foregoing cracks and/or delaminations can reduce and/or eliminate the ability of the package 10 to function properly.

SUMMARY

The present invention is directed generally toward microelectronic packages and methods for forming such packages. A package in accordance with one aspect of the invention includes a support member having an interior surface and an exterior surface facing opposite from the interior surface. A microelectronic substrate is positioned at least proximate to the support member. The microelectronic substrate can have a first surface and a second surface facing opposite from the first surface, with the first surface having an outer edge and facing toward the interior surface of the support member, and with at least a portion of the first surface being spaced apart from the interior surface of the support member to define an intermediate region. At least one conductive coupler is positioned in the intermediate region and is coupled between a first terminal at least proximate to the first surface of the microelectronic substrate and a second terminal at least proximate to the interior surface of the support member. A generally electrically non-conductive material is positioned in the intermediate region and contacts the interior surface of the support member and the first surface of the microelectronic substrate. An outer surface of the generally non-conductive material is recessed inwardly from the outer edge of the microelectronic substrate.

In another aspect of the invention, the first surface of the microelectronic substrate can have a first surface area and the generally non-conductive material can have a contact surface in contact with the first surface of the microelectronic substrate, with the contact surface having a second surface area smaller than the first surface area. In yet another aspect of the invention, the at least one conductive coupler can include an outermost conductive coupler that is recessed inwardly from the outer edge of the microelectronic substrate by a first distance. The outer surface of the generally non-conductive material can be recessed inwardly from the outer edge by a second distance, with the second distance being from about ⅕ to about ⅔ of the first distance.

In yet another aspect of the invention, a packaged microelectronic device can include a support member having a first terminal, an interior surface, and an exterior facing opposite from the interior surface, with the interior surface having a die attach site. A generally non-conductive fill material can be disposed at the die attach site while in a flowable state and can cover a first surface area of the interior surface of the support member. The package can further include a microelectronic substrate having an integrated circuit, a second terminal, a first surface facing toward the die attach site at the interior surface of the support member, and a second surface facing opposite from the first surface, with the first surface of the microelectronic substrate having a second surface area greater than the first surface area, and with at least a portion of the first surface of the microelectronic substrate contacting the fill material. At least one conductive coupler is coupled between the first and second terminals.

A method in accordance with an aspect of the invention includes forming a microelectronic package by positioning a microelectronic substrate proximate to a support member, with the microelectronic substrate having a first surface with an outer edge, and a second surface facing opposite from the first surface. The first surface can face toward an interior surface of the support member. The method can further include contacting a generally electrically non-conductive material with at least one of the interior surface of the support member and the first surface of the microelectronic substrate, and contacting the material with the other of the interior surface of the support member and the first surface of the microelectronic substrate. An outer surface of the material is recessed inwardly from the outer edge of the microelectronic substrate. The method can further include connecting at least one conductive coupler between a first terminal at least proximate to the first surface of the microelectronic substrate and a second terminal at least proximate to the interior surface of the support member. In a further aspect of the invention, the microelectronic substrate can include at least one side surface extending between the first and second surfaces, and the method can include contacting the generally non-conductive material with the microelectronic substrate without contacting the material with any of the side surfaces of the microelectronic substrate.

DETAILED DESCRIPTION

The present disclosure describes microelectronic substrate packages and methods for forming such packages. The term "microelectronic substrate" is used throughout to include substrates upon which and/or in which microelectronic circuits or components, integrated circuits, data storage elements or layers, and/or vias or conductive lines are or can be fabricated. Many specific details of certain embodiments of the invention are set forth in the following description and in FIGS. 2A–3B to provide a thorough understanding of these embodiments. One skilled in the art, however, will understand that the present invention may have additional embodiments, and that the invention may be practiced without several of the details described below.

Figure 2A:
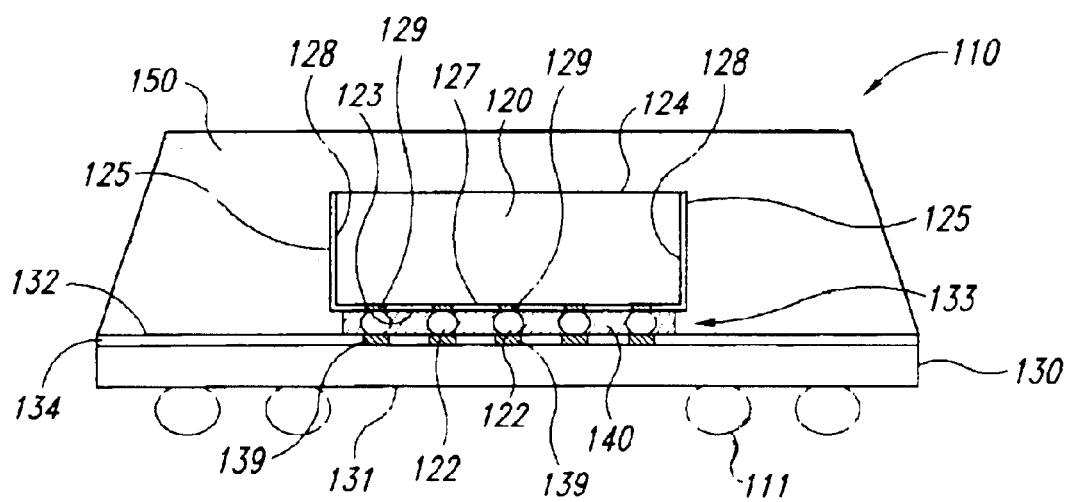
FIG. 2A is a partially schematic, cross-sectional view of a microelectronic package having an underfill material disposed in accordance with an embodiment of the invention.

FIG. 2A is a partially schematic, cross-sectional illustration of a microelectronic package 110 in accordance with an embodiment of the invention. In one aspect of this embodiment, the package 110 can include a microelectronic substrate 120 attached to a support member 130, for example, in a "flip-chip" arrangement. The microelectronic substrate 120 can have a first surface 123, a second surface 124 facing opposite the first surface 123, and side surfaces 125 extending between the first surface 123 and the second surface 124. In one aspect of this embodiment, the first surface 123 can include a polymer layer 127, and the side surfaces 125 can include silicon dioxide layers 128. In other embodiments, these surfaces can include other materials. In any of these embodiments, the first surface 123 can include substrate terminals 129 (such as bond pads) for forming electrical connections with the support member 130.

The support member 130 can include any structure configured to make physical and electrical contact with the microelectronic substrate 120. For example, the support member 130 can include a printed circuit board, or, alternatively, another microelectronic substrate. When the support member 130 includes another microelectronic substrate, the other microelectronic substrate can be of the same type as the microelectronic substrate 120, or, alternatively, the two microelectronic substrates can be of different types. In any of these embodiments, the support member 130 can have a first or exterior surface 131 and a second or interior surface 132 facing opposite the first surface 131. The first surface 131 of the support member 130 can include package couplers 111 (such as solder balls or other terminal devices) for connecting the package 110 to other devices or circuits. The second surface 132 of the support member 130 can face toward the first surface 123 of the microelectronic substrate 120, and can be spaced apart from the first surface 123 to define an intermediate region 133.

In one embodiment, the second surface 132 of the support member 130 can include an interior layer 134, such as a solder mask, that faces toward the microelectronic substrate 120. In a further aspect of this embodiment, the solder mask can include material designated by product number PSR4000-AUS5 and available from Taiyo America, Inc. of Carson City, Nev. In other embodiments, the interior layer 134 can include other materials. In any of these embodiments, the second surface 132 of the support member 130 can include support member terminals 139 (such as bond pads) for forming electrical connections with the microelectronic substrate 120.

The package 110 can further include conductive couplers 122 (such as solder balls or other terminal structures) disposed in the intermediate region 133 and electrically connected between the substrate terminals 129 and the support member terminals 139. A generally non-conductive first material 140 (such as a no-flow underfill die attach material) can be disposed in the intermediate region 133 between the support member 130 and the microelectronic substrate 120, and within the interstices between neighboring conductive couplers 122. In one embodiment, the first material 140 can include FF2000, a flux-containing, no-flow underfill material available from Dexter Electronic Materials, a division of Loctite Corporation of Rocky Hills, Conn. In other embodiments, the first material 140 can include other substances. In any of these embodiments, the first material 140 can both protect the conductive couplers 122 and provide at least temporary adhesion between the microelectronic substrate 120 and the support member 130 during subsequent processing steps.

Subsequent processing steps can include disposing an encapsulating second material 150 (such as an epoxy mold compound) around the microelectronic substrate 120 and around at least a portion of the support member 130 to further protect the physical and electrical connections between the microelectronic substrate 120 and the support member 130. In an alternate embodiment, the second material 150 can be eliminated, and other arrangements can be used to provide additional protection around the microelectronic substrate 120. For example, a cap or other structure not in intimate contact with the microelectronic substrate 120 can be disposed around or partially around the microelectronic substrate 120. A feature of the second material 150 is that it can exert a compressive force on the microelectronic substrate 120. The compressive force can increase the integrity of the connection between the microelectronic substrate 120 and the support member 130, for example, by reducing the likelihood for the first material 140 to separate from either the microelectronic substrate 120 or the support member 130.

Figure 2B:
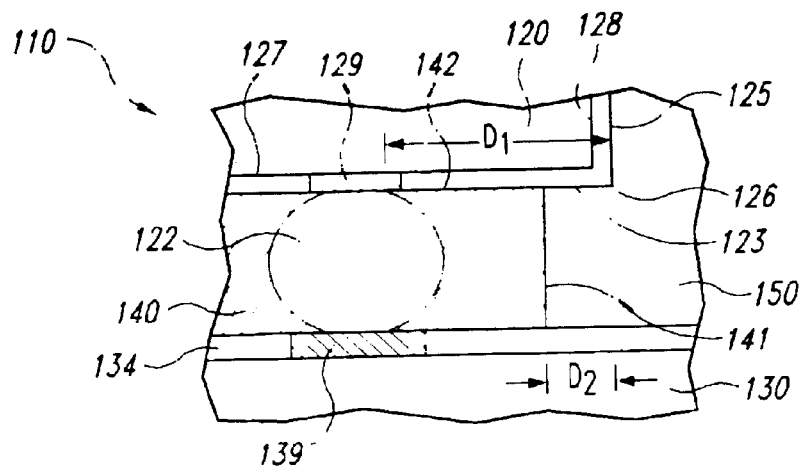
FIG. 2B is an enlarged, partially schematic, cross-sectional view of a portion of the package illustrated in FIG. 2A.

FIG. 2B is an enlarged view of a portion of the package 110 described above with reference to FIG. 2A in accordance with an embodiment of the invention. In one aspect of this embodiment, the first material 140 has an outer surface 141. When the package 110 includes the second material 150, the outer surface 141 can form an interface between the first material 140 and the second material 150. Alternatively, for example, when the package 110 does not include the second material 150, the outer surface 141 can be a free surface. In either embodiment, the outer surface 141 can be recessed inwardly from an outer edge 126 of the first surface 123 of the microelectronic substrate 120. Accordingly, the first material 140 can provide protection to the conductive couplers 122 without extending upwardly along the side surfaces 125 of the microelectronic substrate 120. In one aspect of this embodiment, an outermost conductive coupler 122 can be recessed inwardly from the outer edge 126 by a distance D1, and the outer surface 141 of the first material 140 can be recessed inwardly by a distance D2. In a further aspect of this embodiment, D2 can have a value of from approximately $1/3$ to about $2/3$ of D1. In other embodiments, D2 and D1 can have other relative values.

In another aspect of an embodiment of the package 110 shown in FIG. 2B, the first material 140 can have a contact surface 142 positioned against the first surface 123 of the microelectronic substrate. Because the first material 140 is recessed inwardly from the outer edge 126 of the microelectronic substrate 120, the surface area of the contact surface 142 is less than the surface area of the first surface 123. The fraction of the first surface 123 positioned adjacent to the contact surface 142 depends on the value of D2 selected for each side surface 125 of the microelectronic substrate 120.

In one embodiment, the first material 140 can be dispensed onto a die attach site of the support member 130, and the microelectronic substrate 120 can then be brought into contact with the dispensed first material 140. For example, the first material 140 can be dispensed on the support member 130 in a screen printing or stencil printing process. In one aspect of this embodiment, the amount of the first material 140 dispensed on the support member 120 can be controlled by selecting the thickness of the screen or stencil. Alternatively, a nozzle can dispense the first material 140 onto the support member 130 and the amount of material dispensed by the nozzle can be controlled by volume or by weight. In either embodiment, the proper amount of the first material 140 can be determined experimentally for a variety of different microelectronic substrates 120 and/or support members 130. The experimentally-determined amount of the first material 140 can subsequently be used in a production setting (for the same or a similar combination of microelectronic substrate 120 and support member 130) without measuring each quantity of the first material 140 disposed during production.

In yet another embodiment, the first material 140 can be dispensed on the microelectronic substrate 120 (rather than on the support member 130), and then the microelectronic substrate 120 (with the support material 140 attached) can be brought into contact with the support member 130. For example, the microelectronic substrate 120 can be dipped in the first material 140 in a manner generally similar to that disclosed in U.S. patent application Ser. No. 09/651,448, previously incorporated herein by reference. In any of these embodiments, the first material 140 can initially be at least partially flowable to fill the interstices between neighboring conductive couplers. The flowability of the first material 140 can then be partially or completely reduced (e.g., the first material can be solidified and/or cured) in subsequent known process steps.

One feature of embodiments of the package 110 described above with reference to FIGS. 2A–B is that the first material 140 does not extend upwardly along the side surfaces 125 of the microelectronic substrate 120, and is instead be recessed inwardly from the side surfaces 125. An advantage of this feature is that the first material 140 will not cause delamination of the side surfaces 125 because it does not contact the side surfaces 125. A further advantage of this feature is that the first material 140 will not exert a tensile force on the side surfaces 125 (which can cause cracks in the microelectronic substrate 120), again, because the first material 140 does not contact the side surfaces 125.

Still another feature of embodiments of the package 110 described above with reference to FIGS. 2A–B is that, by positioning the first material 140 entirely beneath the microelectronic substrate 120, the entire volume of the first material 140 can be subjected to compressive loads, for example, from the microelectronic substrate 120 and/or the second material 150 pressing down on the microelectronic substrate 120. An advantage of this feature is that the likelihood for the first material 140 to separate from either the first surface 123 of the microelectronic substrate 120 or the second surface 132 of the support member 130 can be reduced compared to existing arrangements.

Yet another feature of embodiments of the package 110 described above with reference to FIGS. 2A–B is that the first material 140 may have a greater adhesive affinity for the first surface 123 of the microelectronic substrate 120 than for the side surfaces 125. For example, the first material 140 may have a greater affinity for the polymer layer 127 on the first surface 123 of the microelectronic substrate 120 than for the silicon dioxide layer 128 on the side surfaces 125. An advantage of an arrangement described above with reference to FIGS. 2A–B is that the first material 140 may be less likely to separate from the microelectronic substrate 120 because it can contact only those materials for which it has a greater affinity.

Figure 1:
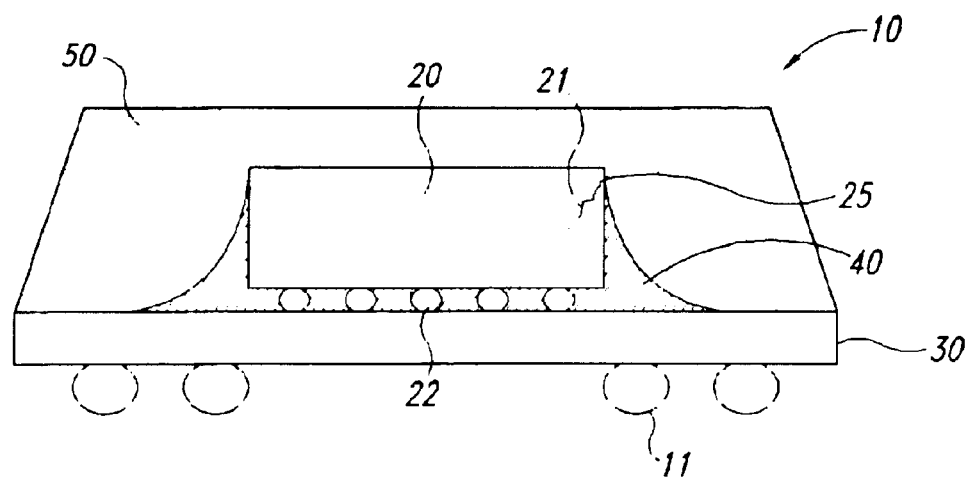
FIG. 1 is a partially schematic, cross-sectional view of a microelectronic package in accordance with the prior art.

Another feature of embodiments of the package 110 described above with reference to FIGS. 2A–B is that the volume of the package 110 occupied by the first material 140 can be less than the volume occupied by underfill materials in existing arrangements (such as the one shown in FIG. 1) because the first material 140 is recessed from the outer edge 126 of the microelectronic substrate 120. Even though the first material 140 may have a different coefficient of thermal expansion (CTE) than that of the support member 130, the microelectronic substrate 120, and/or the second material 150, the effect of this difference can be reduced by disposing the first material 140 in accordance with embodiments described above. For example, the stress applied by the first material 140 to the components around it during cooling is typically correlated with the volume of the first material 140. By reducing the volume of the first material 140, an embodiment shown in FIGS. 2A–B can reduce the likelihood for the first material 140 to exert a potentially damaging force on the surrounding components.

Figure 3A:
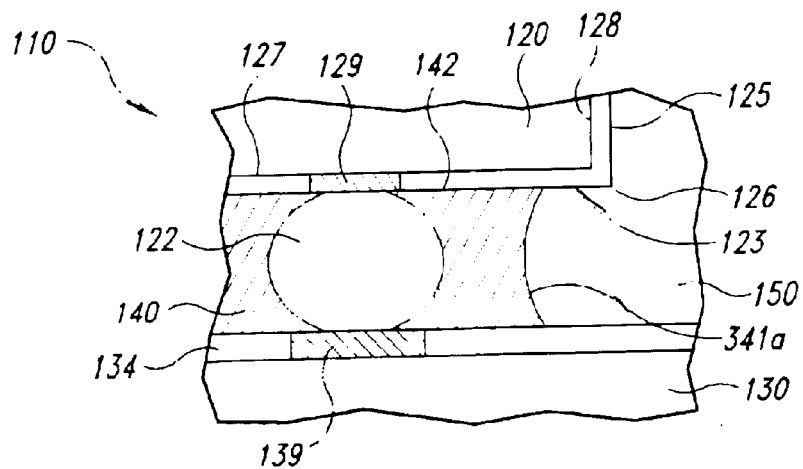
FIGS. 3A–B illustrate packages having first materials disposed in accordance with still further embodiments of the invention.
Figure 3B:
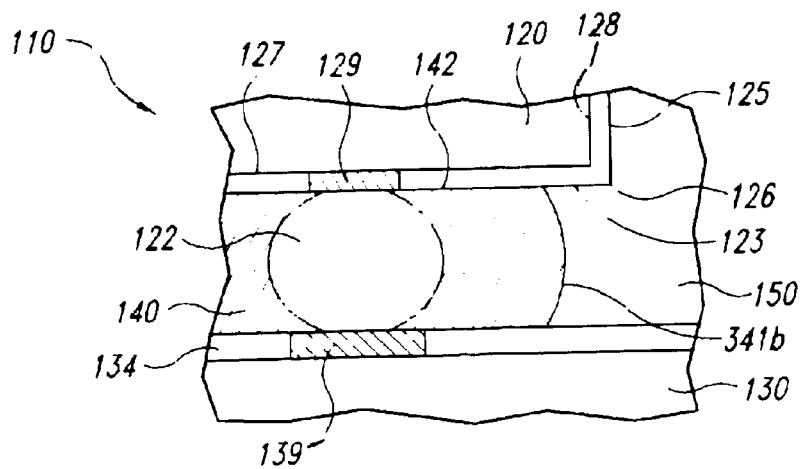

In one aspect of the foregoing embodiments described above with reference to FIGS. 2A–B, the outer surface 141 of the first material 140 can form a generally straight line extending between the microelectronic substrate 120 and the support member 130. In other embodiments, the shape of the outer surface can be different depending, for example, on the surface tension of the first material 140. For example, as shown in FIG. 3A, the first material 140 can have a concave outer surface 341a or, as shown in FIG. 3B, the first material 140 can have a convex outer surface 341b. In either of these alternate embodiments, the first material 140 can be recessed inwardly from the side surfaces 125 of the microelectronic substrate 140, as described above.

From the foregoing, it will be appreciated that specific embodiments of the invention have been described herein for purposes of illustration, but that various modifications may be made without deviating from the spirit and scope of the invention. For example, the package 110 can have arrangements other than a flip chip arrangement. In one such embodiment, the package 110 can have a chip-on-board arrangement, with the substrate terminals 129 positioned at least proximate to the second surface 124 of the microelectronic substrate 120, and the support member terminals 139 spaced outwardly away from the microelectronic substrate 120. The substrate terminals 129 can be connected to the support member terminals 139 with wire bonds or other suitable conductive couplers. In another such embodiment (a board-on-chip arrangement), the substrate terminals 129 can be positioned at least proximate to the first surface 123 of the microelectronic substrate 120, and the support member terminals 139 can be positioned at least proximate to the first surface 131 of the support member 130. The substrate terminals 129 can be coupled to the support member terminals 139 with wire bonds that pass through a slot or other opening extending through the support member 130. In still further embodiments, the package 110 can have still further arrangements. Accordingly, the invention is not limited except as by the appended claims.

We claim:

1. A microelectronic package, comprising:
    a support member having an interior surface, a first terminal at least proximate to the interior surface, and an exterior surface facing opposite from the interior surface;
    a microelectronic substrate positioned at least proximate to the support member, the microelectronic substrate having a first surface, a second terminal at least proximate to the first surface, and a second surface facing opposite from the first surface, the first surface of the microelectronic substrate having an outer edge and facing toward the interior surface of the support member with at least a portion of the first surface being spaced apart from the interior surface of the support member to define an intermediate region;
    at least one conductive coupler positioned in the intermediate region and coupled between the first and second terminals; and
    a generally electrically non-conductive, non-gaseous material positioned in the intermediate region, the material contacting the interior surface of the support member and the first surface of the microelectronic substrate and having an outer surface recessed inwardly from the outer edge of the microelectronic substrate.

2. The package of claim 1 wherein the at least one conductive coupler includes an outermost conductive coupler, and wherein the outermost conductive coupler is recessed inwardly from the outer edge of the microelectronic substrate by a first distance, further wherein the generally non-conductive material contacts the outermost conductive coupler, and wherein the outer surface of the material is recessed inwardly from the outer edge of the microelectronic substrate by a second distance, the second distance being from about $1/5$ to about $2/3$ the first distance.

3. The package of claim 1 wherein the first surface of the microelectronic substrate has a first surface area and wherein the generally non-conductive material has a contact surface in contact with the first surface of the microelectronic substrate, and wherein the contact surface has a second surface area with the second surface area smaller than the first surface area.

4. The package of claim 1 wherein the microelectronic substrate has a side surface between the first and second surfaces, and wherein the generally non-conductive material has an outer surface that is discontinuous with the side surface.

5. The package of claim 1 wherein the generally non-conductive material includes a first material, and wherein the package further comprises an encapsulating second material disposed adjacent to at least one of the microelectronic substrate, the support member and the first material.

6. The package of claim 1 wherein the generally non-conductive material includes a first material, and wherein the package further comprises an encapsulating second material disposed adjacent to the microelectronic substrate, the support member and the first material, and wherein the first material forms a generally concave interface with the second material.

7. The package of claim 1 wherein the generally non-conductive material includes a first material, and wherein the package further comprises an encapsulating second material disposed adjacent to the microelectronic substrate, the support member and the first material, and wherein the first material forms a generally convex interface with the second material.

8. The package of claim 1 wherein the generally non-conductive material includes a first material, and wherein the package further comprises an encapsulating second material disposed adjacent to the microelectronic substrate, the support member and the first material, and wherein the second material includes an epoxy mold compound.

9. The package of claim 1 wherein the generally non-conductive material includes an underfill material.

10. The package of claim 1 wherein the microelectronic substrate includes at least one side surface extending between the first and second surfaces, and wherein the generally non-conductive material does not contact any of the side surfaces of the microelectronic substrate.

11. The package of claim 1 wherein the at least one conductive coupler includes a solder ball.

12. The package of claim 1 wherein the at least one conductive coupler is a first conductive coupler, further wherein the package further comprises a second conductive coupler depending from the exterior surface of the support member and configured to electrically couple the support member to devices external to the package.

13. A microelectronic package, comprising:
    a support member having an interior surface, a first terminal at least proximate to the interior surface, and an exterior surface facing opposite from the interior surface;
    a microelectronic substrate positioned proximate to the support member with an intermediate region positioned between the support member and the microelectronic substrate, the microelectronic substrate having a first surface with a first surface area facing toward the interior surface of the support member, a second terminal at least proximate to the first surface, and a second surface facing opposite from the first surface;
    at least one conductive coupler positioned in the intermediate region and coupled between the first and second terminals; and
    a generally electrically non-conductive, non-gaseous material disposed in the intermediate region, the material being in contact with the interior surface of the support member and the first surface of the microelectronic substrate, the material having a contact surface adjacent to the first surface of the microelectronic substrate, the contact surface having a second surface area, the second surface area being smaller than the first surface area.

14. The package of claim 13 wherein the generally non-conductive material includes a first material, and wherein the package further comprises an encapsulating second material disposed adjacent to at least one of the support member and the microelectronic substrate.

15. The package of claim 13 wherein the first surface of the microelectronic substrate has an outer edge, and wherein the at least one conductive member includes an outermost conductive member, and wherein the outermost conductive member is recessed inwardly from the outer edge of the microelectronic substrate by a first distance, further wherein the generally non-conductive material contacts the outermost conductive member and is recessed inwardly from the outer edge by a second distance, the second distance being from about $1/5$ to about $2/3$ the first distance.

16. The package of claim 13 wherein the generally non-conductive material includes a first material, and wherein the package further comprises an encapsulating second material disposed adjacent to at least one of the microelectronic substrate, the support member and the first material.

17. The package of claim 13 wherein the microelectronic substrate has a side surface between the first and second surfaces, further wherein the generally non-conductive material has an outer surface that is discontinuous with the side surface.

18. The package of claim 13 wherein the generally non-conductive material includes a first material, and wherein the package further comprises an encapsulating second material disposed adjacent to the microelectronic substrate, the support member and the first material, and wherein the first material forms a generally concave interface with the second material.

19. The package of claim 13 wherein the generally non-conductive material includes a first material, and wherein the package further comprises an encapsulating second material disposed adjacent to the microelectronic substrate, the support member and the first material, and wherein the first material forms a generally convex interface with the second material.

20. The package of claim 13 wherein the microelectronic substrate has at least one side surface between the first and second surfaces, further wherein the generally non-conductive material does not contact any of the side surfaces of the microelectronic substrate.

21. A packaged microelectronic device, comprising:
a support member having a first terminal, an interior surface, and an exterior surface facing opposite from the interior surface, the interior surface having a die attach site;
a generally non-conductive, non-gaseous fill material disposed at the die attach site while in a flowable state, the fill material covering a first surface area of the interior surface of the support member;
a microelectronic substrate having an integrated circuit, a second terminal, a first surface facing toward the die attach site at the interior surface of the support member, and a second surface facing opposite from the first surface, the first surface of the microelectronic substrate having a second surface area greater than the first surface area of the support member, with at least a portion of the first surface of the microelectronic substrate contacting the fill material; and
at least one conductive coupler coupled between the first and second terminals.

22. The package of claim 21 wherein the at least one conductive coupler includes an outermost conductive coupler, and wherein the outermost conductive coupler is recessed inwardly from the outer edge of the microelectronic substrate by a first distance, further wherein the generally non-conductive material contacts the outermost conductive coupler, and wherein the outer surface of the material is recessed inwardly from the outer edge of the microelectronic substrate by a second distance, the second distance being from about ⅕ to about ⅔ the first distance.

23. The package of claim 21 wherein the generally non-conductive material includes a first material, and wherein the package further comprises an encapsulating second material disposed adjacent to at least one of the microelectronic substrate, the support member and the first material.

24. The package of claim 21 wherein the first surface of the microelectronic substrate is spaced apart from the interior surface of the support member to define an intermediate region, and wherein the fill material is disposed in the intermediate region.

25. The package of claim 21 wherein the first surface of the microelectronic substrate is spaced apart from the interior surface of the support member to define an intermediate region, and wherein the fill material is disposed in the intermediate region, further wherein the first terminal is positioned at least proximate to the interior surface of the support member and the second terminal is positioned at least proximate to the first surface of the microelectronic substrate, still further wherein the conductive coupler includes a solder ball connected between the first and second terminals.

26. The package of claim 21 wherein the microelectronic substrate includes at least one side surface extending between the first and second surfaces, and wherein the generally non-conductive material does not contact any of the side surfaces of the microelectronic substrate.

27. A microelectronic package, comprising:
a support member having an interior surface, a plurality of first terminals at least proximate to the interior surface, and an exterior surface facing opposite from the interior surface;
a microelectronic substrate positioned at least proximate to the support member, the microelectronic substrate having a first surface, a plurality of second terminals at least proximate to the first surface, and a second surface facing opposite from the first surface, the first surface of the microelectronic substrate having an outer edge and facing toward the interior surface of the support member with at least a portion of the first surface of the microelectronic substrate being spaced apart from the interior surface of the support member to define an intermediate region;
a plurality of conductive couplers positioned in the intermediate region and connected between the first and second terminals;
a generally electrically non-conductive, non-gaseous first material disposed in the intermediate region, the first material contacting the first surface of the microelectronic substrate only inwardly from the outer edge; and
an encapsulating second material disposed adjacent to at least one of the microelectronic substrate, the support member and the first material.

28. The package of claim 27 wherein the conductive couplers include an outermost conductive coupler, and wherein the outermost conductive coupler is recessed inwardly from the outer edge of the microelectronic substrate by a first distance, further wherein the first material contacts the outermost conductive coupler and has an outer surface extending between the interior surface of the support member and the first surface of the microelectronic substrate, the outer surface of the first material being recessed inwardly from the outer edge of the microelectronic substrate by a second distance, the second distance being from about ⅕ to about ⅔ the first distance.

29. The package of claim 27 wherein the first surface of the microelectronic substrate has a first surface area, and wherein the first material has a contact surface in contact with the first surface of the microelectronic substrate, and wherein the contact surface has a second surface area with the second surface area smaller than the first surface area.

30. The package of claim 27 wherein the first material forms a generally flat interface with the second material.

31. The package of claim 27 wherein the first material forms a generally concave interface with the second material.

32. The package of claim 27 wherein the first material forms a generally convex interface with the second material.

33. The package of claim 27 wherein the microelectronic substrate includes at least one side surface extending between the first and second surfaces of the microelectronic substrate, and wherein the generally non-conductive first material does not contact any of the side surfaces of the microelectronic substrate.

34. The package of claim 27 wherein the conductive couplers include solder balls.

35. The package of claim 27 wherein the first material has a first coefficient of thermal expansion and the second material has a second coefficient of thermal expansion, further wherein the second coefficient of thermal expansion is lower than the first coefficient of thermal expansion.

36. A microelectronic device package, comprising:
a support member having an interior surface, a first terminal at least proximate to the interior surface, and an exterior surface facing opposite from the interior surface;
a microelectronic substrate positioned at least proximate to the support member, the microelectronic substrate having a first surface, a second terminal at least proximate to the first surface, a second surface facing opposite from the first surface, and a third surface extending between the first and second surfaces, wherein the first surface of the microelectronic substrate faces toward the interior surface of the support member with at least a portion of the first surface being spaced apart from the interior surface of the support member to define an intermediate region;
at least one conductive coupler positioned in the intermediate region and connected between the first and second terminals; and
a generally electrically non-conductive, non-gaseous material positioned in the intermediate region, the material contacting the interior surface of the support member and the first surface of the microelectronic substrate and being spaced apart from the third surface of the microelectronic substrate.

37. The package of claim 36 wherein the generally non-conductive material includes a first material, and wherein the package further comprises an encapsulating second material disposed adjacent to at least one of the microelectronic substrate and the support member.

38. The package of claim 36 wherein the at least one conductive coupler includes an outermost conductive coupler, and wherein the outermost conductive coupler is recessed inwardly from an outer edge of the first surface of the microelectronic substrate by a first distance, further wherein the generally non-conductive material contacts the outermost conductive coupler and has an outer surface recessed inwardly from the outer edge by a second distance, the second distance being from about ⅕ to about ⅔ the first distance.

39. The package of claim 36 wherein the first surface of the microelectronic substrate has a first surface area and wherein the generally non-conductive material has a contact surface in contact with the first surface of the microelectronic substrate, and wherein the contact surface has a second surface area with the second surface area smaller than the first surface area.

40. The package of claim 36 wherein the generally non-conductive material includes a first material, and wherein the package further comprises an encapsulating second material disposed adjacent to the microelectronic substrate, the support member and the first material.

41. The package of claim 36 wherein the generally non-conductive material has an outer surface that is recessed inwardly from an outer edge of the first surface of the microelectronic substrate.

42. The package of claim 36 wherein the generally non-conductive material has an outer surface recessed inwardly from the third surface of the microelectronic substrate.

43. The package of claim 36 wherein the first surface of the microelectronic substrate includes a polymer layer and the third surface of the microelectronic substrate includes a silicon dioxide layer.

44. A microelectronic package, comprising:
a support member having an interior surface, a first terminal at least proximate to the interior surface, and an exterior surface facing opposite from the interior surface;
a microelectronic substrate positioned at least proximate to the support member, the microelectronic substrate having a first surface, a second terminal at least proximate to the first surface, and a second surface facing opposite from the first surface, the first surface of the microelectronic substrate having an outer edge and facing toward the interior surface of the support member with at least a portion of the first surface being spaced apart from the interior surface of the support member to define an intermediate region;
at least one conductive coupler positioned in the intermediate region and coupled between the first and second terminals; and
a generally electrically non-conductive, non-gaseous material positioned in the intermediate region adjacent both an inwardly facing surface and an outwardly facing surface of the at least one conductive coupler, the material contacting the interior surface of the support member and the first surface of the microelectronic substrate and having an outer surface recessed inwardly from the outer edge of the microelectronic substrate.

45. The package of claim 44 wherein the at least one conductive coupler includes an outermost conductive coupler, and wherein the outermost conductive coupler is recessed inwardly from the outer edge of the microelectronic substrate by a first distance, further wherein the generally non-conductive material contacts the outermost conductive coupler, and wherein the outer surface of the material is recessed inwardly from the outer edge of the microelectronic substrate by a second distance, the second distance being from about ⅕ to about ⅔ the first distance.

46. The package of claim 44 wherein the first surface of the microelectronic substrate has a first surface area and wherein the generally non-conductive material has a contact surface in contact with the first surface of the microelectronic substrate, and wherein the contact surface has a second surface area with the second surface area smaller than the first surface area.

47. The package of claim 44 wherein the microelectronic substrate has a side surface between the first and second surfaces, and wherein the generally non-conductive material has an outer surface that is discontinuous with the side surface.

48. The package of claim 44 wherein the generally non-conductive material includes a first material, and wherein the package further comprises an encapsulating second material disposed adjacent to at least one of the microelectronic substrate, the support member and the first material.

49. The package of claim 44 wherein the generally non-conductive material includes a first material, and wherein the package further comprises an encapsulating second material disposed adjacent to the microelectronic substrate, the support member and the first material, and wherein the first material forms a generally flat interface with the second material.

50. The package of claim 44 wherein the generally non-conductive material includes a first material, and wherein the package further comprises an encapsulating second material disposed adjacent to the microelectronic substrate, the support member and the first material, and wherein the first material forms a generally concave interface with the second material.

51. The package of claim 44 wherein the generally non-conductive material includes a first material, and wherein the package further comprises an encapsulating second material disposed adjacent to the microelectronic substrate, the support member and the first material, and wherein the first material forms a generally convex interface with the second material.

52. The package of claim 44 wherein the generally non-conductive material includes a first material, and wherein the package further comprises an encapsulating second material disposed adjacent to the microelectronic substrate, the support member and the first material, and wherein the second material includes an epoxy mold compound.

53. The package of claim 44 wherein the generally non-conductive material includes an underfill material.

54. The package of claim 44 wherein the microelectronic substrate includes at least one side surface extending between the first and second surfaces, and wherein the generally non-conductive material does not contact any of the side surfaces of the microelectronic substrate.

55. The package of claim 44 wherein the at least one conductive coupler includes a solder ball.

56. The package of claim 44 wherein the at least one conductive coupler is a first conductive coupler, further wherein the package further comprises a second conductive coupler depending from the exterior surface of the support member and configured to electrically couple the support member to devices external to the package.

57. A microelectronic package, comprising:
a support member having an interior surface, a first terminal at least proximate to the interior surface, and an exterior surface facing opposite from the interior surface;
a microelectronic substrate positioned proximate to the support member with an intermediate region positioned between the support member and the microelectronic substrate, the microelectronic substrate having a first surface with a first surface area facing toward the interior surface of the support member, a second terminal at least proximate to the first surface, and a second surface facing opposite from the first surface;
at least one conductive coupler positioned in the intermediate region and coupled between the first and second terminals; and a generally electrically non-conductive, non-gaseous material disposed in the intermediate region adjacent both an inwardly and an outwardly facing surface of the at least one conductive coupler, the material being in contact with the interior surface of the support member and the first surface of the microelectronic substrate, the material having a contact surface adjacent to the first surface of the microelectronic substrate, the contact surface having a second surface area, the second surface area being smaller than the first surface area.

58. The package of claim 57 wherein the generally non-conductive material includes a first material, and wherein the package further comprises an encapsulating second material disposed adjacent to at least one of the support member and the microelectronic substrate.

59. The package of claim 57 wherein the first surface of the microelectronic substrate has an outer edge, and wherein the at least one conductive member includes an outermost conductive member, and wherein the outermost conductive member is recessed inwardly from the outer edge of the microelectronic substrate by a first distance, further wherein the generally non-conductive material contacts the outermost conductive member and is recessed inwardly from the outer edge by a second distance, the second distance being from about ⅕ to about ⅔ the first distance.

60. The package of claim 57 wherein the generally non-conductive material includes a first material, and wherein the package further comprises an encapsulating second material disposed adjacent to at least one of the microelectronic substrate, the support member and the first material.

61. The package of claim 57 wherein the microelectronic substrate has a side surface between the first and second surfaces, further wherein the generally non-conductive material has an outer surface that is discontinuous with the side surface.

62. The package of claim 57 wherein the generally non-conductive material includes a first material, and wherein the package further comprises an encapsulating second material disposed adjacent to the microelectronic substrate, the support member and the first material, and wherein the first material forms a generally concave interface with the second material.

63. The package of claim 57 wherein the generally non-conductive material includes a first material, and wherein the package further comprises an encapsulating second material disposed adjacent to the microelectronic substrate, the support member and the first material, and wherein the first material forms a generally convex interface with the second material.

64. The package of claim 57 wherein the microelectronic substrate has at least one side surface between the first and second surfaces, further wherein the generally non-conductive material does not contact any of the side surfaces of the microelectronic substrate.

* * * * *